United States Patent [19]

Ju

[11] 4,386,418
[45] May 31, 1983

[54] CONDUCTORLESS SWAP GATE FOR ION-IMPLANTED CONTIGUOUS-DISK BUBBLE DEVICES

[75] Inventor: Kochan Ju, San Jose, Calif.

[73] Assignee: International Business Machines Corporation, Armonk, N.Y.

[21] Appl. No.: 335,042

[22] Filed: Dec. 28, 1981

[51] Int. Cl.³ ............................................. G11C 19/08
[52] U.S. Cl. ..................................................... 365/36
[58] Field of Search ....................... 365/12, 15, 16, 36, 365/41

[56] References Cited

U.S. PATENT DOCUMENTS 4,079,461 3/1978 George et al. ......................... 365/12

OTHER PUBLICATIONS

IEEE Transactions on Magnetics–vol. Mag.–13, No. 6, Nov. 1977, pp. 1744-1764.
"Design and Functional Characteristics of a 3 μm, 254K bit Block Replicate Bubble Memory Device" by D. C. Bullock et al., J. Appl. Phys. 50(3) Mar. 1979 pp. 2222-2224.
"Bubble Rectifiers and Reverse Rotation Transfer Gates Based on Gaps in Ion Implanted Propagation Patterns" by R. Wolfe et al., J. Appl. Phys. 52(3) Mar. 1981, pp. 2377-2379.

*Primary Examiner*—James W. Moffitt
*Attorney, Agent, or Firm*—Joseph E. Kieninger

[57] ABSTRACT

A conductorless swap gate for ion-implanted contiguous-disk bubble devices using a folded minor loop and means for reversing the rotation of the rotating magnetic field is disclosed. The bubble device has a major loop, a folded minor loop, a swap gate containing at least one element positioned between the major loop and the folded end of the minor loop. The swap gate has a first portion for interchanging bubbles with the major loop, a second portion for transferring bubbles from a first region of the folded end of the minor loop, and a third portion for receiving bubbles from the second region of the folded end of the minor loop. Activation of the means for reversing the rotation of the rotating magnetic field causes the swap function to be effected. In a preferred embodiment, the device has a swap gate that has two elements and functions as a true swap gate.

9 Claims, 19 Drawing Figures

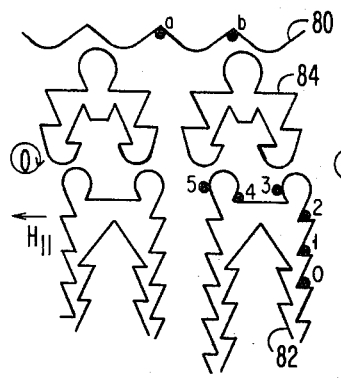
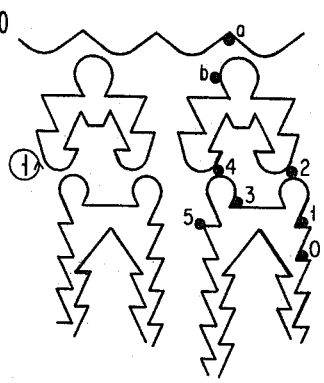
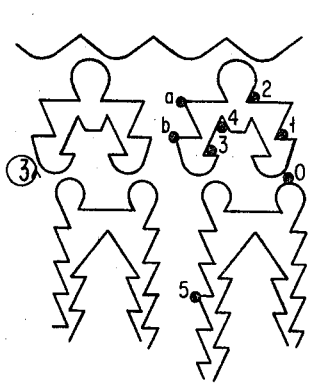
FIG. 5A  FIG. 5B  FIG. 5C
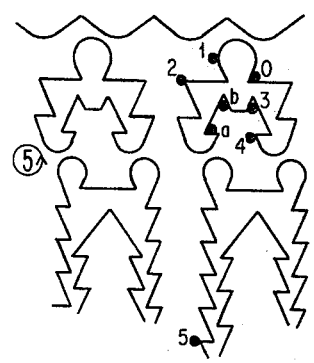
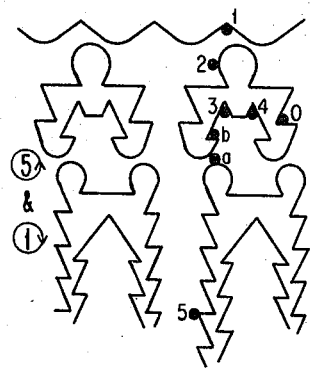
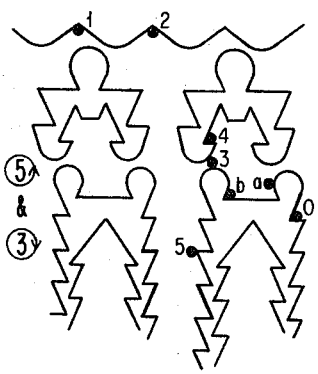
FIG. 5D  FIG. 5E  FIG. 5F
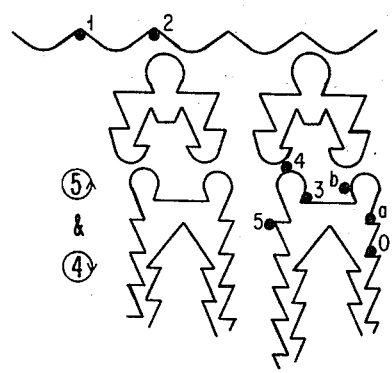
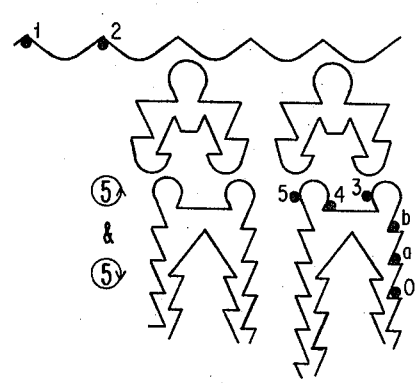
FIG. 5G  FIG. 5H

CONDUCTORLESS SWAP GATE FOR ION-IMPLANTED CONTIGUOUS-DISK BUBBLE DEVICES

DESCRIPTION

1. Technical Field

This invention relates to ion-implanted contiguous-disk bubble devices and more particularly to a conductorless swap gate.

2. Background Art

The block-replicate architecture which has been widely used in permalloy bubble devices requires the use of swap gates. Swap gates interchange bubbles between the write major loop path and the minor loop paths. Swap gates are referred to as true swap gates when the bubble in one path, for example the major loop, is transferred into the vacancy in the minor loop path that is left by the bubble which is being transferred from the minor loop into the major loop path and visa versa. Although swap gates are most commonly used to interchange bubbles between the write major loop and the minor loops, they may also be employed in other parts of the bubble device wherever data in two separate paths need to be exchanged. All true swap gates used in permalloy-type bubble devices such as the one described by Bullock et al in the *Journal of Applied Physics,* Vol. 50, pages 2222–4, March 1979, employ conductors to activate the transfer of bubbles. Due to the fundamental difference between permalloy type bubble devices and ion-implanted contiguous-disk bubble devices, the swap gate designs for permalloy bubble devices cannot be implemented in ion-implanted contiguous-disk bubble devices.

An example of a two-way transfer gate that does not employ conductors for ion-implanted contiguous disk bubble devices was described by R. Wolfe et al in *Journal of Applied Physics,* Vol. 52, page 2377–2379 (March 1981) and is shown in FIGS. 1A and 1B. This arrangement, which includes a major loop, a minor loop and a swap or idler disk element positioned therebetween is a simple bidirectional reverse rotation transfer gate. FIG. 1A illustrates in three steps how one and a half reverse rotations starting at 270° and ending at 90° are used to transfer a bubble from the upper loop part way around an idler disk to a lower loop. Transfer in the opposite direction is very similar with reverse rotation starting at 90° and ending at 270°. When a transfer-out reverse rotation cycle in this device is followed immediately by a transfer-in sequence, the bit that is removed from the minor loop is replaced by a new one from the major loop. This is not a true swap gate, however, since the bit from the major loop is placed in the minor loop one rotating field cycle behind the replacement bit. For example, the bubble 12 from the major loop is one cycle behind the vacant position 14 which the bubble previously residing in the minor loop occupied prior to the swap operation. In a true swap gate arrangement, the incoming bubble 12 would be transferred into position 14. The FIG. 1A structure is also not a swap gate because the old data in the minor loops must be cleared and positioned in the major loop before the new data in the major loop can be entered into the minor loops. The unavailability of a swap gate has handicapped the bubble industry in their work on contiguous-disk bubble devices. The directionality of the merge gate is denoted by the dot (.) in FIG. 1B.

An active swap gate for ion-implanted contiguous-disk bubble devices using folded minor loops and conductors is described in co-pending application Ser. No. 331,481 filed Dec. 16, 1981, and assigned to the assignee of this invention. This bubble device has a major loop, a folded minor loop and a swap element positioned between the major loop and the folded end of the minor loop. The swap element has a first portion for interchanging bubbles with the major loop, a second portion for receiving bubbles from a first region of the folded end of the minor loop, and a third portion for transferring bubbles from the first portion to a second region of the folded end of the minor loop. The folded end of the minor loop also has a third region positioned between the first and second regions to form two bubble storage locations. The bubble device has a conductor associated with the major loop and the first portion of the swap element to form a first transfer gate. The device also includes a second conductor associated with the folded minor loop and the second portion of the swap element to form a second transfer gate. The third portion of the swap element combines with the folded minor loop to form a merge element. The merge element may either be passive or include a third transfer conductor.

SUMMARY OF THE INVENTION

It is a primary object of this invention to provide a conductorless swap gate for contiguous-disk bubble devices.

It is another object of this invention to provide a true conductorless swap gate for contiguous-disk bubble devices.

It is yet another object of this invention to provide a swap gate that requires less pad space.

These and other objects are accomplished by the disclosed conductorless swap gate for ion-implanted contiguous-disk bubble devices using a folded minor loop and means for reversing the rotation of the rotating magnetic field. The bubble device has a major loop, a folded minor loop, a swap gate containing at least one element positioned between the major loop and the folded end of the minor loop. The swap gate has a first portion for interchanging bubbles with the major loop, a second portion for transferring bubbles to the first region of the folded end of the minor loop, and a third portion for receiving bubbles from the second region of the folded end of the minor loop. Activation of the means for reversing the rotation of the rotating magnetic field causes the swap function to be effected. In one preferred embodiment, the device has a swap gate that has two elements and functions as a true swap gate. Both elements have a first portion that is associated with the major loop. Each element has another portion that is associated with the folded end of the minor loop. The two elements have sufficient space to accommodate the data stream being swapped. In another preferred embodiment the device has a swap gate that has a single element with three sides. The two sides that meet the portion that is associated with the major loop are the same length. The third side which faces the folded end of the minor loop needs to have a sufficient length to accommodate the data string being swapped.

Other objects of this invention will be apparent from the following detailed description, reference being made to the accompanying drawings wherein the specific embodiments of the invention are shown.

BRIEF DESCRIPTION OF THE DRAWINGS

FIGS. 5A-5H are top views showing the operation of the device shown in FIG. 3.

DESCRIPTION OF THE PREFERRED EMBODIMENTS

Figure 1A:
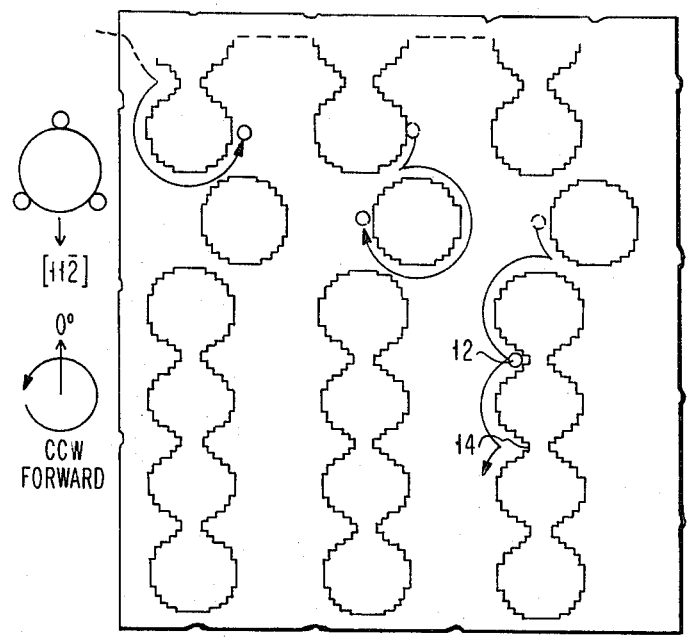
FIG. 1A is a top view of a prior art transfer gate.
Figures 1B, 2, 3:
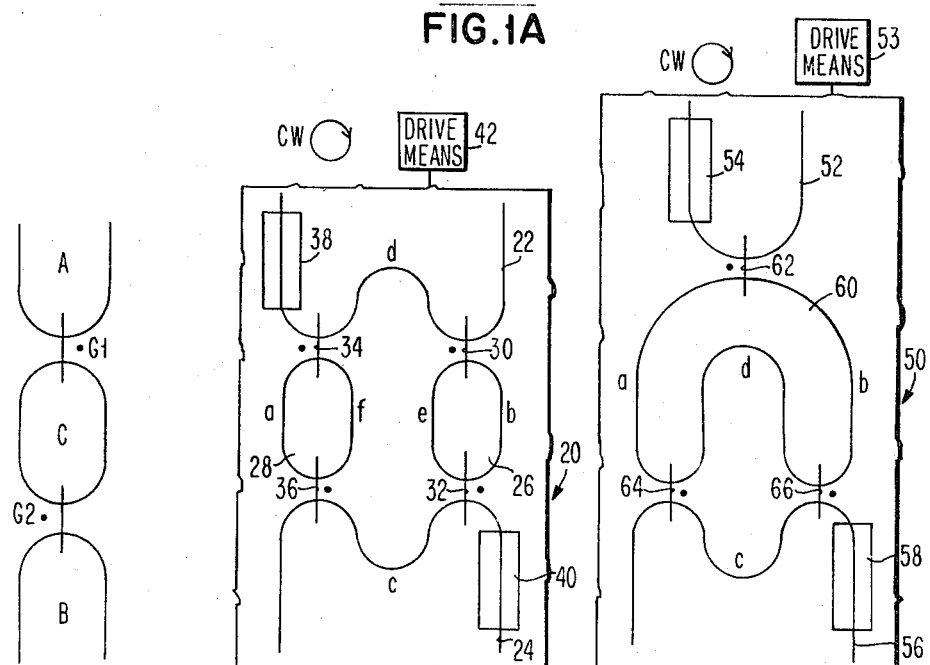
FIG. 1B is a schematic view of the FIG. 1A transfer gate.
FIG. 2 is a schematic view of a preferred embodiment of a conductorless swap gate in accordance with this invention.
FIG. 3 is a schematic view of a second preferred embodiment of a conductorless swap gate in accordance with this invention.

As shown in FIG. 2, in a preferred embodiment, the ion-implanted contiguous disk bubble device 20 includes a first propagation path 22, for example a write major loop, and a second propagation path 24, for example, a folded end minor loop. Swap elements 26 and 28 having sides B, E and A, F respectively, are positioned between the propagation paths 22 and 24. Swap element 26 forms a merge gate 30 with path 22 and a merge gate 32 with path 24. Similarly, swap element 28 forms a merge gate 34 with path 22 and a merge gate 36 with path 24. During routine forward clockwise rotation, swap elements 26 and 28 do not interact with the propagation of bubbles in paths 22 or 24 and do not contain data. The data that is to be swapped are designated by the blocks 38 in propagation path 22 and block 40 in path 24.

To perform the swap operation, the direction of the rotating in-plane field is reversed by means 42 to provide counterclockwise rotation field. The data 38 passes through merge gate 34 into side A and through merge gate 36 into side F. At the same time, data in block 24 propagates through merge gate 32 into side B and through merge gate 30 into side E. The direction of the rotating in-plane field is then reversed by means 42 so that it propagates in a clockwise direction and the block of data 38 residing in side F is propagated through merge gate 36 into region C of path 24 and through merge gate 32 to the original data block 40 location. At the same period of time, data block 40 will propagate through merge gate 30 into section D, the region in path 22 between merge gates 30 and 34. Data block 40 is then propagated through merge gate 34 into the original data block 38 location, thereby completing the swap operation.

During the reverse rotation, the data originally residing in region C prior to the swap operation will propagate into side F also. The length, that is the number of bits, of side A is set to be equal to region C such that when data block 38 enters side F it will follow right behind the region C data. In this case, there will be no interference between data block 38 and region C data, and also during the subsequent forward rotation data block 38 will be leading ahead of region C data into the write bit location.

Similarly, the length of B is the same as the length of D in order to have data block 40 follow right behind the region D data into side E during the reverse rotation. To insure the number of data transfer-out equal to the number of data transfer-in, we have side A equal to side B so that for every bit of data block 38 passing through merge gate 36 there will be a bit of data block 40 passed through merge gate 30. The length of side F needs to be larger than the sum of the lengths of side A plus region C so that no data in region C transfers over to path 22. Similarly, Side E needs to be greater than the sum of region D and side B in order to prevent data from region D from propagating through gate 32 to interfere with data coming from path 24 into side B during the reverse rotation.

Thus, in order to achieve a swap operation, the following equations are required.

$$a=b=c=d$$

$$f>2a$$

$$e>2b$$

However, due to the presence of merge gates with more than one orientation, depending upon the starting phase and the way of the length of the side is counted, the length of the sides here can be varied by one count. The operation of the FIG. 2 swap gate will hereinafter be described in detail with respect to FIGS. 4A-G.

As shown in FIG. 3, in another preferred embodiment, the swap gate is designed mainly for major/minor loop block swap operation. This design allows swapping of all major data block with the corresponding minor loop data in one set of reverse-forward rotation operation. In this case, the whole block of data that transfers into the major loop will be shifted forward by a fixed number of bit positions. The bubble device 50 includes a write major loop 52 containing data block 54, a minor loop 56 having a data block 58 and a swap element 60 positioned therebetween. The major loop 52 forms a merge gate 62 with swap element 60. Swap element 60 forms a merge gate 64 and 66 with minor loop 56. Side A of swap element 60 extends from merge gate 62 to merge gate 64 and side B extends from merge gate 62 to merge gate 66. Side D of swap element 60 extends from merge gate 64 to merge gate 66.

The swap operation for this embodiment is as follows: During the reverse rotation effected by means 53, data block 54 will propagate through merge gate 62 into side A and through merge gate 64 into side D. During this time data block 58 will propagate through merge gate 66 into side B and through merge gate 62 and rest in side A. During the following forward rotation, data block 58 will pass through 62 into major loop 52 while data block 54 propagates from side D through merge gate 64 into side C and through merge gate 66 into the original data block 58 position. Side A is the same length as Side C to insure that data block 1 will follow right behind the data from region C into side D during the reverse rotation. As in the FIG. 2 design, side B equals side A to insure the same manner of data bit exchange between the two loops during the swap operation. The length of section D is set to be large enough to be able to contain both data from region C and data block 54.

Figures 4A, 4B, 4C:
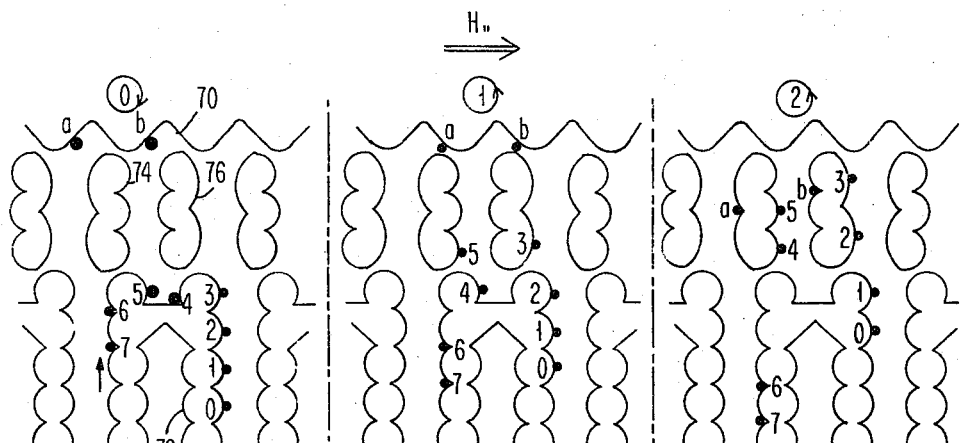
FIGS. 4A-4G are top views showing the operation of the device shown in FIG. 2.
Figures 4D, 4E, 4F:
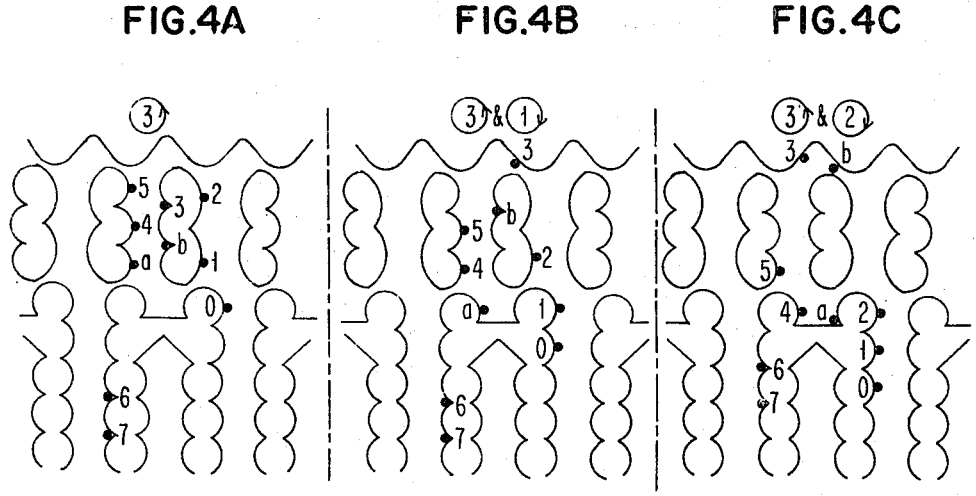
Figure 4G:
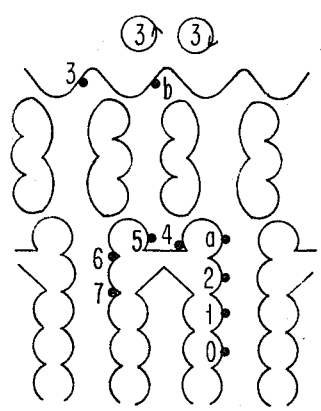

FIGS. 4A through 4G illustrates the swap operation for the FIG. 2 embodiment having a double period major loop. A cycle starts in this case in the 3:00 o'clock direction. FIG. 4A illustrates a swap gate design in the initial bit configuration to the swap operation. In this design, bit A in the major loop and bit 3 in the minor loop 72 can be accomplished with the swap elements 74 and 76 with three reverse and three forward cycle rotations. The bit configurations at the end of the first, second and third of the reverse rotation cycles and the first, second and third cycles of the subsequent forward rotation cycles are illustrated in FIGS. 4B, 4C, 4D, 4E, 4F and 4G respectively.

The swap gate shown in FIG. 4 provides a true swap so that at the end of the swap operation the two corresponding data exchange their "absolute" bit locations, not just the bit location relative to the two data streams. The rest of the data reside at the same bit location as that prior to the swap operation. However, for a major-minor block swap operation, this type of swap gate will require two sets of reverse-forward rotation operations.

FIG. 5 illustrates the swap operation for the embodiment shown in FIG. 3. In this case a block of data A plus B from the major loop 80 is swapped with data 1 plus 2 from the minor loop 82 by using the swap gate 84. With this design it takes five reverse rotations and then five forward rotations to complete the swap operation. In FIG. 5A, bubbles labeled A, B located in the major loop 80 and bubbles labeled 0, 1, 2, 3, 4 and 5 located in the minor loop 82 as they are positioned before the swap operation. The rotating field is assumed pointed at 9:00 o'clock direction. The bit configurations at the end of the first, third and fifth reverse rotating field cycles are shown in FIGS. 5B, 5C and 5D respectively. The bit configurations at the end of the first, third, fourth and fifth cycles of the subsequent forward rotation cycles are shown in FIGS. 5E, 5F, 5G and 5H respectively. Bits A and B move into the minor loop bit 1 and bit 2 locations, whereas bits 1 and 2 move into the major loop and advance three cycles from the original A and B locations.

Although a preferred embodiment of this invention has been described, it is understood that numerous variations may be made in accordance with the principles of this invention.

What is claimed is:

1. The combination for providing a conductorless swap gate for ion-implanted contiguous-disk bubble devices comprising
   a major loop,
   a minor loop having a folded end portion facing said major loop, said end portion having a first region and a second region separated by a third region,
   a swap gate comprising at least one element positioned between said major loop and said minor loop, said swap gate having a first portion associated with said major loop, said swap gate having a second portion associated with said minor loop first region, said swap gate having a third portion associated with said minor loop second region, and
   means for reversing the rotation of the rotating magnetic field wherein activation of said means causes the swap function to be effected.

2. The combination as described in claim 1 wherein said swap gate has sufficient space to accommodate the data string being swapped.

3. The combination as described in claim 1 wherein said swap gate comprises two elements.

4. The combination as described in claim 1 wherein said swap gate comprises one element having a first side, a, connecting said first and second portions and a second side, b, connecting said first and third portions.

5. The combination as described in claim 4 where $a=b$.

6. The combination as described in claim 4 wherein said swap gate has a third side connecting said second and third portions that has sufficient space to accommodate the data string being swapped.

7. The combination for providing a conductorless swap gate for ion-implanted contiguous-disk bubble devices comprising
   a major loop,
   a minor loop having a folded end portion facing said major loop, said end portion having a first region and a second region separated by a third region,
   a swap gate comprising a first element having sides a and f and a second element having sides b and e, said first element having a first portion associated with said major loop and a second portion associated with said minor loop first region, said second element having a first portion associated with said major loop and a second portion associated with said minor loop second region, and
   means for reversing the rotation of the rotating magnetic field wherein activation of said means causes the swap function to be effected.

8. The combination as described in claim 7 wherein the sides $a=b$, $f>2a$ and $e>2b$.

9. The combination as described in claim 7 wherein the sides e plus f have sufficient space to accommodate the data string being swapped.

* * * * *